United States Patent
Fenouillet-Beranger et al.

(10) Patent No.: US 8,877,600 B2
(45) Date of Patent: Nov. 4, 2014

(54) METHOD FOR MANUFACTURING A HYBRID SOI/BULK SEMICONDUCTOR WAFER

(71) Applicants: STMicroelectronics (Crolles 2) SAS, Crolles (FR); STMicroelectronics S.A., Montrouge (FR); STMicroelectronics, Inc., Coppell, TX (US); Commissariat à l'Énergie Atomique et aux Énergies Alternatives, Paris (FR)

(72) Inventors: Claire Fenouillet-Beranger, Grenoble (FR); Stephane Denorme, Crolles (FR); Nicolas Loubet, Guilderland, NY (US); Qing Liu, Guilderland, NY (US); Emmanuel Richard, le Champ-Pres-Froges (FR); Pierre Perreau, Varces (FR)

(73) Assignees: STMicroelectronics, Inc., Coppell, TX (US); STMicroelectronics SA, Montrouge (FR); STMicroelectronics (Crolles 2) SAS, Crolles (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 14/104,903

(22) Filed: Dec. 12, 2013

(65) Prior Publication Data

US 2014/0170834 A1    Jun. 19, 2014

(30) Foreign Application Priority Data

Dec. 13, 2012  (FR) ...................................... 12 62012

(51) Int. Cl.
*H01L 21/20*   (2006.01)
*H01L 21/762*  (2006.01)

(52) U.S. Cl.
CPC .............................. *H01L 21/76283* (2013.01)
USPC ........................................... 438/413; 438/404

(58) Field of Classification Search
USPC ........................................... 438/400, 404, 413
See application file for complete search history.

(56) References Cited

U.S. PATENT DOCUMENTS

| | | | |
|---|---|---|---|
| 2005/0199984 A1 | 9/2005 | Nowak | |
| 2008/0194082 A1* | 8/2008 | Kato et al. | ..................... 438/483 |
| 2008/0274595 A1* | 11/2008 | Spencer et al. | ............... 438/154 |
| 2009/0170295 A1 | 7/2009 | Vincent et al. | |
| 2013/0320401 A1* | 12/2013 | Yan et al. | ....................... 257/192 |
| 2014/0127878 A1* | 5/2014 | Assefa et al. | ................... 438/429 |

OTHER PUBLICATIONS

French Search Report and Written Opinion dated Mar. 21, 2013 from corresponding French Application No. 12/62012.

* cited by examiner

*Primary Examiner* — Bradley K Smith
(74) *Attorney, Agent, or Firm* — Gardere Wynne Sewell LLP

(57) ABSTRACT

A method for manufacturing a hybrid SOI/bulk substrate, including the steps of starting from an SOI wafer comprising a single-crystal semiconductor layer called SOI layer, on an insulating layer, on a single-crystal semiconductor substrate; depositing on the SOI layer at least one masking layer and forming openings crossing the masking layer, the SOI layer, and the insulating layer, to reach the substrate; growing by a repeated alternation of selective epitaxy and partial etching steps a semiconductor material; and etching insulating trenches surrounding said openings filled with semiconductor material, while encroaching inwards over the periphery of the openings.

8 Claims, 3 Drawing Sheets

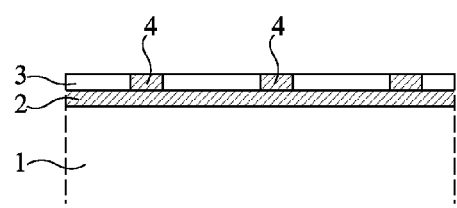
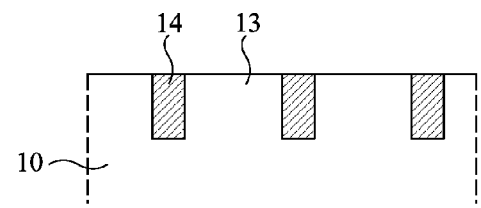
Fig 1A          Fig 1B
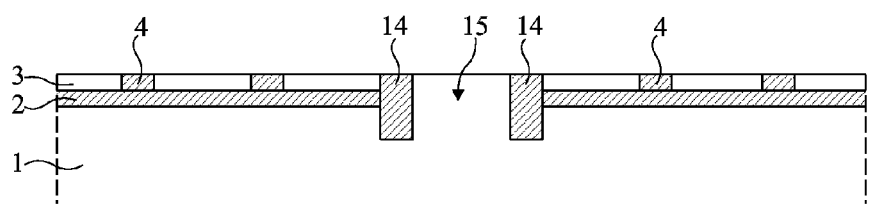
Fig 2

METHOD FOR MANUFACTURING A HYBRID SOI/BULK SEMICONDUCTOR WAFER

CROSS REFERENCE TO RELATED APPLICATION

This application claims priority to French Patent Application No. 12/62012, filed Dec. 13, 2012, which is hereby incorporated by reference to the maximum extent allowable by law.

BACKGROUND

1. Technical Field

The present disclosure relates to a method for manufacturing, on the same semiconductor wafer, areas of SOI ("Semiconductor-On-Insulator") type, and solid substrate (bulk) areas.

2. Discussion of the Related Art

To improve the performance of MOS transistors carrying out the logic functions of an integrated circuit and to decrease their dimensions, a solution is to manufacture such MOS transistors inside and on top of a thin single-crystal semiconductor layer formed on an insulating layer laid on a single-crystal semiconductor substrate. The thin single-crystal semiconductor layer is then currently called "SOI layer". A substrate or a semiconductor wafer coated with such an SOI layer will be called SOI substrate or wafer.

As technology develops, the minimum dimensions of transistors tend to be made smaller and smaller, with a gate length capable of being smaller than 20 nm, and the thickness of the SOI layer is correlatively decreased to values smaller than 10 nm, and even to values smaller than 5 nm. SOI layers with such a small thickness are not suited to the manufacturing of components capable of withstanding voltages higher than the voltages of logic components and/or of conducting higher currents than those implied in the operation of logic components, which, for example, occurs for electrostatic discharge protection devices. It is desirable to form these last components, here called "power components" to differentiate them from logic components, directly in a single-crystal semiconductor substrate.

It is thus desired to form a mixed or hybrid wafer comprising SOI-type areas suited to the forming of logic components, and bulk areas suited to the forming of power components. Further, for the manufacturing of components inside and on top of the SOI-type areas and inside and on top of the bulk areas, the upper surfaces of these areas should be as exactly as possible in a same plane, which especially enables carrying out optimized photolithography steps.

Known methods for forming such a hybrid wafer, such as described in U.S. Pat. No. 5,894,152, have various disadvantages. They are difficult to implement, need a large number of steps, and/or are not adapted to the case where the thickness of the SOI layer has a value smaller than 10 nm, or even smaller than 5 nm.

SUMMARY

Thus, a method for manufacturing a hybrid SOI/bulk substrate is provided, which comprises the steps of:

a) starting from an SOI wafer comprising a single-crystal semiconductor layer called SOI layer, on an insulating layer, on a single-crystal semiconductor substrate;

b) depositing on the SOI layer at least one masking layer and forming openings crossing the masking layer, the SOI layer, and the insulating layer, to reach the substrate;

c) growing, by a repeated alternation of selective epitaxy and partial etching steps, a semiconductor material; and d) etching insulating trenches surrounding said openings filled with semiconductor material while encroaching inwards over the periphery of the openings.

According to an embodiment, step c) is carried on until the central portion of the upper surface of the semiconductor material is at the same level as the upper surface of the SOI layer.

According to an embodiment, the semiconductor material of the substrate and that of the SOI layer are silicon.

According to an embodiment, the thickness of the SOI layer ranges between 3 and 10 nm.

According to an embodiment, the thickness of the insulating layer ranges between 5 and 50 nm.

According to an embodiment, the masking layer comprises a stack of a layer of a silicon oxide and of a layer of a silicon nitride.

According to an embodiment, the method further comprises, between steps a) and b), a step of forming silicon-germanium regions in portions of the SOI layer.

According to an embodiment, the silicon-germanium regions are formed by condensation.

BRIEF DESCRIPTION OF THE DRAWINGS

The foregoing and other features and advantages will be discussed in detail in the following non-limiting description of specific embodiments in connection with the accompanying drawings in which:

FIGS. 1A and 1B are cross-section views schematically illustrating, respectively, an SOI substrate and a bulk;

FIG. 2 is a cross-section view schematically illustrating a hybrid SOI/bulk substrate;

For clarity, the same elements have been designated with the same reference numerals in the different drawings. Further, as usual in the representation of integrated circuits, the various drawings are not to scale.

DETAILED DESCRIPTION

Figure 3A:
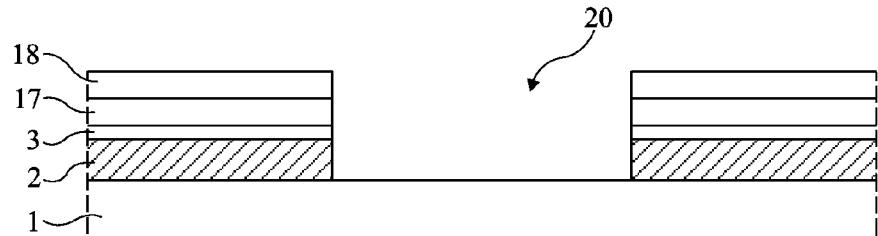
FIGS. 3A to 3D are cross-section views schematically illustrating successive steps of an embodiment of a first phase of a method for manufacturing a hybrid SOI/bulk substrate.

FIGS. 1A and 1B will help recall what is conventionally called SOI substrate and bulk.

FIG. 1A is a simplified cross-section view of a portion of an SOI wafer. Such a wafer is formed from a semiconductor substrate 1, generally a single-crystal semiconductor substrate, supporting a thin insulating layer 2, currently called a BOX layer, supporting a thin layer 3 of a single-crystal semiconductor, currently called an SOI layer.

Thin semiconductor layer 3 is divided into active areas, in each of which one or several components, currently a single MOS transistor, are capable of being formed. The active areas are separated by insulating regions 4 which, in top view, surround each of the active areas. Thus, in an SOI wafer, each of the components formed in an active area is totally insulated from the neighboring components by insulating layer 2 and by insulating regions 4.

A so-called bulk semiconductor wafer, such as illustrated in FIG. 1B, is formed of a single-crystal semiconductor material wafer 10 having one or several epitaxial layers possibly developed at its surface. The upper portion of the wafer is divided into active areas 13 by insulating trenches 14. Components are formed in the active areas. The insulating trenches should be relatively deep to provide a relative insulation between neighboring components. The insulation is further provided by buried layers having appropriate doping levels intended to limit leakage currents between neighboring components. Insulating trenches 14 are often called STI, for shallow trench insulation, or DTI, for deep trench insulation. Of course, this concept of deep trench or of shallow trench depends on the technology used and on the depth by which the doped areas of each of the components formed in the active areas penetrate into the substrate.

As previously indicated, each of the SOI and bulk technologies has its own advantages, and it is sometimes desirable to have regions where components can be formed in an SOI layer and components can be formed in a bulk, on a same semiconductor wafer. It is thus desired to obtain hybrid wafers comprising SOI substrate and bulk regions.

FIG. 2 shows, on a semiconductor substrate 1, an insulating layer 2 and an SOI layer 3 provided with its insulating regions 4. At the center of the drawing, a region where the semiconductor substrate rises up to the surface and is separated from the neighboring components by STI or DTI insulating trenches 14 has been shown. Trenches 14 surround an active area 15 where a component can be formed.

In the following, to simplify the description, the specific case where the material of the solid substrate and that of the SOI layer are both single-crystal silicon is considered, but this is an example only of possible semiconductor materials.

To obtain a hybrid wafer of the type in FIG. 2, it has been provided, for example, in above-mentioned U.S. Pat. No. 5,894,152, to start from an SOI-type wafer, to form an opening crossing the SOI layer and the underlying insulating layer to reach the substrate, and then to perform a silicon epitaxy from the bottom of the exposed substrate. This method raises many issues, among which the following can be mentioned.

On the other hand, if, as essentially provided by the above-mentioned patent, a non-selective silicon epitaxy is performed, silicon deposits everywhere and it then has to be removed by a chemical mechanical polishing method, currently called CMP. The performing of a chemical mechanical polishing raises may issues, especially when it is desired to accurately stop at the SOI layer so that the upper surface of the bulk portion is at the same level as the upper surface of the SOI layer. Indeed, when the SOI layer is very it risks being damaged by a chemical mechanical polishing.

On the other hand, implementing this method implies coating the edges of the opening with a protection layer such as a silicon nitride layer, and then to remove the bottom of this layer. This requires additional steps, some of which are relatively delicate, especially the removal of the layer bottom.

It has already been attempted to perform selective epitaxies from the bottom of the opening, the edges of the opening being protected by a silicon nitride layer with the above-mentioned disadvantages. Further, generally, when a selective epitaxy is performed, the silicon deposited by epitaxy appears not to develop uniformly, but, due to its crystallinity, forms facets as it develops. The silicon thus grows faster in certain directions than in others and, again, it appears to be necessary to perform a chemical mechanical polishing to planarize the upper surface of the epitaxial layer, which causes the above-mentioned disadvantages.

The performing of a selective epitaxy while avoiding the silicon faceting issue has been described, for example, in Nicolas Loubet et al.'s article disclosed at the SSDM Conference, Tokyo, Sep. 22-24, 2010. To achieve this, successive steps of epitaxial deposition of a very thin silicon layer and of etching of this layer are carried out, and this process is repeated several times to obtain the desired height. This article indicates that, provided to very accurately control epitaxial growth temperature, the precursor composition and the growth and etching times, the drain and source regions of a MOS transistor may be raised by a non-faceted planar epitaxial growth. However, again, to implement this process, said article provides for the edges of the opening from which the epitaxial growth is performed to be coated with a specific material, in the case in point silicon nitride. The above-mentioned disadvantage of having to first coat openings with silicon nitride, and then remove the silicon nitride from the bottom of the opening then reappears.

FIGS. 3A to 3D describe successive steps of obtaining by epitaxy a silicon layer with a flat bottom in an opening formed through an SOI structure, where the sides of this opening are not coated with a protection layer such as silicon nitride.

FIG. 3A shows an SOI wafer comprising, as in FIG. 2, a single-crystal silicon substrate 1 coated with an insulating layer (BOX) 2 and with a single-crystal SOI layer 3. The SOI wafer is coated with a masking layer, for example formed of a first silicon oxide layer 17 and of a second silicon nitride layer 18, forming a hard mask. An opening 20 is formed in this assembly, all the way to the upper surface of the silicon of substrate 1.

Then, alternated and repeated steps of selective epitaxial growth of silicon and of partial etching are performed.

Figure 3B:
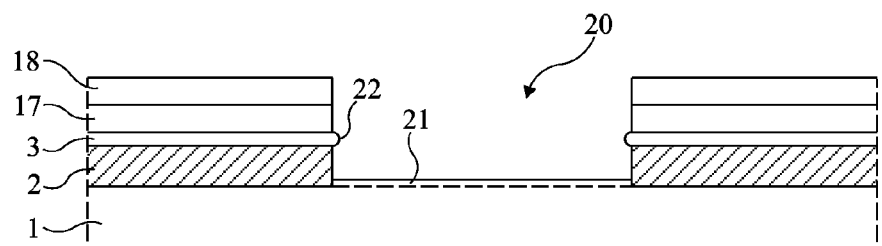

FIG. 3B illustrates the aspect of the deposition obtained after a first growth and etch step. The selective growth only occurs from the apparent silicon surfaces: a substantially planar silicon layer 21 is formed on substrate 1 at the bottom of opening 20 and a slight silicon outgrowth 22 is formed in a ring from the exposed side of SOI layer 3. In the conditions of Nicolas Loubet's above-mentioned article, the upper surface of silicon layer 21 is substantially planar.

Figure 3C:
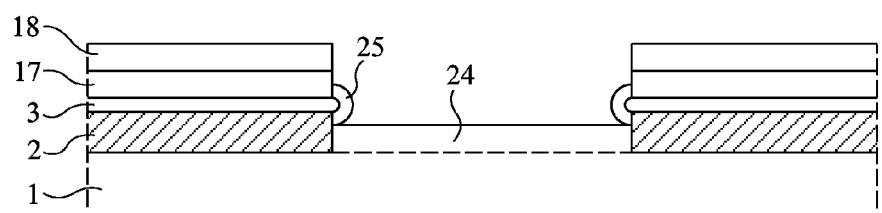

FIG. 3C shows the aspect of the deposition obtained after a number of epitaxial deposition and etching cycles. At the bottom of the opening, a substantially planar layer 24 and an outgrowth 25 formed from the exposed side of SOI layer 3 have been obtained.

Figure 3D:
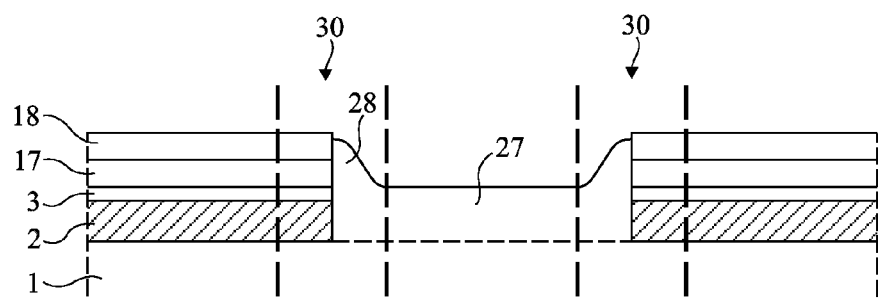

After a number of iterations of the epitaxial deposition and etching cycles, the structure illustrated in FIG. 3D is obtained. The upper surface of the deposited silicon, 27, has the shape of a bowl with a flat bottom, and comprises a peripheral edge (a protrusion) 28 due to the growth from the exposed side of SOI layer 3. Due to the iterative character of the epitaxy and etching operations, the thickness of the deposition may be very well calibrated so that the upper surface of the bottom of the bowl is exactly at the level of the upper surface of SOI layer 3.

Then, once this structure has been obtained, insulating trenches (STI or DTI) are formed by any means at the periphery of bowl 27, to remove peripheral protrusion 28. The limits between which a peripheral insulating trench 30 will be formed have been illustrated in vertical bold dotted lines in FIG. 3D.

Figure 4A:
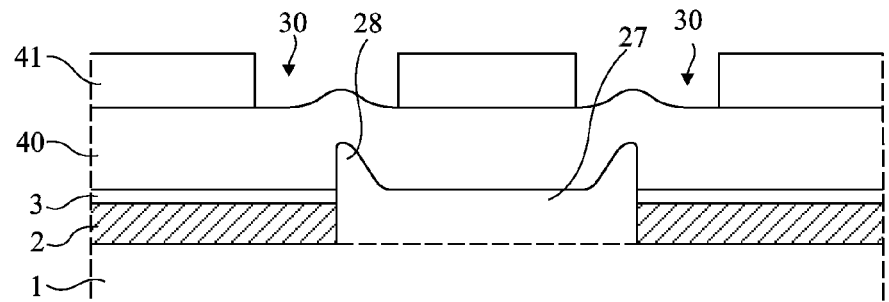
FIGS. 4A to 4C are cross-section views schematically illustrating successive steps of an embodiment of a second phase of a method for manufacturing a hybrid SOI/bulk substrate.
Figure 4B:
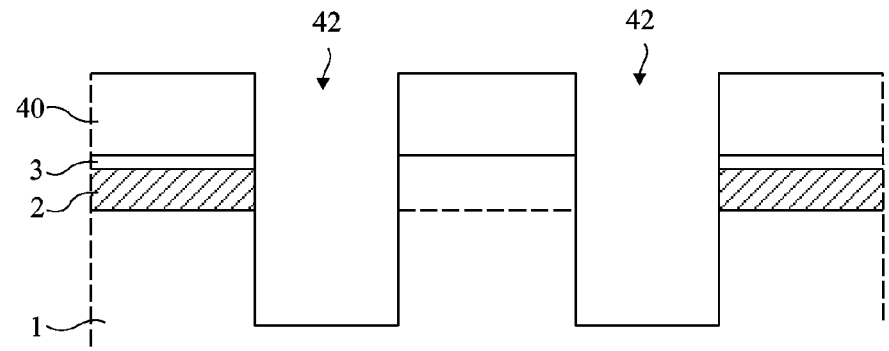
Figure 4C:
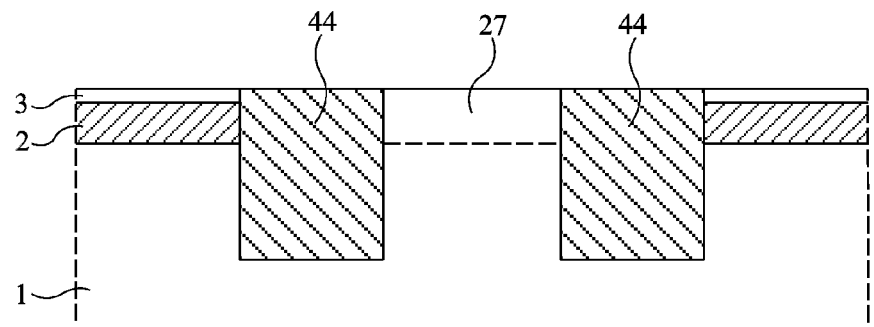

FIGS. 4A to 4C illustrate an embodiment of the insulating trenches. Other embodiments of these trenches may be used.

What matters is for these trenches to be formed at the periphery of the layer deposited by epitaxy, and to remove lateral protrusions 28 of layer 27.

The step illustrated in FIG. 4A corresponds to the structure of FIG. 3D comprising substrate 1, SOI structure 2-3, and epitaxial filling 27 with a bowl-shaped upper surface having its flat bottom at the same level as the upper surface of SOI layer 3, this bowl comprising a peripheral protrusion 28. Masking layer 17-18 has been removed by selective etching. A new masking-protection layer 40 has been deposited. Masking-protection layer 40 is deposited with a sufficient thickness, or according to an adapted method, to smooth its upper surface. Thus, if the upper surface of layer 40 comprises a raised area facing peripheral protrusion 28, this raised area is lower than the height of protrusion 28. Layer 40 is for example formed of a sandwich of a 5-nm silicon oxide layer and of a silicon nitride layer having a thickness ranging between 50 and 70 nm.

On layer 40 is deposited a photolithography layer 41, comprising a resin layer 30 opposite to peripheral protrusion 28 of epitaxial filling layer 27, with opening 30 extending on either side of protrusion 38.

At the step illustrated in FIG. 4B, the forming of insulating trenches 42 which penetrate all the way to the inside of substrate 1 has been shown. Due to the choice of positioning openings 30 in masking layer 41, partly opposite to an SOI area of the substrate and partly opposite to an epitaxial bulk area, there only remains the central portion of layer 27, having a planar upper surface at the same level as the upper surface of SOI layer 3.

At the step illustrated in FIG. 4C, the insulating trenches have been filled with an appropriate material 44, currently silicon oxide, and protection layer 40 has been removed.

It should be noted that the generally hybrid SOI/bulk substrate forming method, comprising steps such as those described in relation with FIGS. 3A to 3D and steps such as those described in relation with FIGS. 4A to 4C have many advantages:

A planar upper surface of an epitaxial layer developed from the substrate is obtained, which planar upper surface can be at the same level as the upper surface of an SOI layer;

This result may be obtained without having to provide a polishing step (CMP).

This result may be obtained without having to provide a protection layer such as a silicon nitride layer on the sides of an opening formed in an SOI layer and an underlying insulating layer.

This result may be obtained due to the doing away with the prejudice according to which a totally planar selective epitaxial growth has to be performed. On the contrary, in the method described herein, the developed epitaxial layer has a peripheral protrusion which is no disadvantage since it is then removed on forming of insulating trenches.

Of course, the present invention is likely to have various alterations, modifications, and improvements, especially as to the details of the method steps and to the selection of the materials used.

The method has been described in the case where substrate 1 is a single-crystal silicon substrate, the SOI layer also is a single-crystal silicon layer, and the epitaxial filling layer also is a single-crystal silicon layer. However, the method is not limited to this specific case. Other semiconductors may be used. In particular, the epitaxial growth may be a growth of a mixed semiconductor such as silicon-germanium. Similarly, the SOI layer may be a layer of silicon-germanium or of another semiconductor. Further, in the case where the semiconductor described hereabove is silicon, before the first step of FIG. 3A, a portion of SOI layer 3 may be transformed into silicon-germanium, for example, by condensation methods. It is possible to do it at an initial step of the method since the epitaxial growth method described herein is a low-temperature epitaxial growth mode which will not damage the silicon-germanium layer formed by condensation.

As an example of numerical values, in the case of a technology where the gate length of the transistors which will be formed in the SOI layer is on the order of 20 nanometers, the various layers may have the following thicknesses:

insulating layer 2 (BOX): from 5 to 50 nm,
SOI layer 3: from 3 to 10 nm,
layer 40: from 50 to 80 nm and the following dimensions may be selected:

minimum dimension of the active areas in the SOI layer: for example, on the order of 70×70 nm,
minimum final width of regions 27 obtained at the end of the method (step of FIG. 4C): on the order of 0.12 µm,
width of insulating trenches 42: on the order of 42 nm,
penetration depth of insulating trenches 42 into the substrate: from 0 to 50 nm.

In the present description, unless otherwise indicated, terms "substantially" and "on the order of" mean "to within 10%".

The above numerical examples have been given in the specific case of a technology where the gate length of logic MOS transistors is on the order of 20 nm. Such dimensions will be adapted to the technology used, and will be smaller in the case of a technology where the gate length is smaller than 20 nm.

Further, it should be understood that a specific area where an epitaxial growth from an opening crossing an SOI structure and reaching the substrate has been performed has been previously described. Several different areas will actually be formed simultaneously and may have different dimensions. Further, at the same time as the insulating trenches surrounding the epitaxial regions are dug (steps of FIGS. 4A to 4C), other insulating trenches having other functions may be dug simultaneously.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a hybrid SOI/bulk substrate, comprising the steps of:
    a) starting from an SOI wafer comprising a single-crystal semiconductor SOI layer, on an insulating layer, on a single-crystal semiconductor substrate;
    b) depositing on the SOI layer at least one masking layer and forming openings crossing the masking layer, the SOI layer, and the insulating layer, to reach the substrate;
    c) growing, without forming spacers, by a repeated alternation of selective epitaxy and partial etching steps a semiconductor material, up to the desired final level; and
    d) etching insulating trenches surrounding said openings filled with semiconductor material while encroaching inwards over the periphery of the openings.

2. The method of claim 1, wherein step c) is carried on until the central portion of the upper surface of the semiconductor material is at the same level as the upper surface of the SOI layer.

3. The method of claim 1, wherein the semiconductor material of the substrate and that of the SOI layer are silicon.

4. The method of claim 1, wherein the thickness of the SOI layer ranges between 3 and 10 nm.

5. The method of claim 1, wherein the thickness of the insulating layer ranges between 5 and 50 nm.

6. The method of claim 3, wherein the masking layer comprises a stack of a layer of a silicon oxide and of a layer of a silicon nitride.

7. The method of claim 3, further comprising, between steps a) and b), a step of forming silicon-germanium regions in portions of the SOI layer.

8. The method of claim 7, wherein the silicon-germanium regions are formed by condensation.

* * * * *